United States Patent
Kim et al.

(10) Patent No.: US 12,150,321 B2
(45) Date of Patent: Nov. 19, 2024

(54) OPTOELECTRONIC DEVICE INCLUDING MORPHOLOGICAL STABILIZING LAYER

(71) Applicant: The Regents of the University of Michigan, Ann Arbor, MI (US)

(72) Inventors: Jongchan Kim, Ann Arbor, MI (US); Stephen R. Forrest, Ann Arbor, MI (US)

(73) Assignee: The Regents of the University of Michigan

( * ) Notice: Subject to any disclaimer, the term of this patent is extended or adjusted under 35 U.S.C. 154(b) by 280 days.

(21) Appl. No.: 17/528,821

(22) Filed: Nov. 17, 2021

(65) Prior Publication Data

US 2022/0199932 A1    Jun. 23, 2022

Related U.S. Application Data

(60) Provisional application No. 63/126,676, filed on Dec. 17, 2020.

(51) Int. Cl.
| | | |
|---|---|---|
| *H10K 30/80* | (2023.01) | |
| *H10K 10/46* | (2023.01) | |
| *H10K 50/11* | (2023.01) | |
| *H10K 71/00* | (2023.01) | |
| *H10K 102/00* | (2023.01) | |

(52) U.S. Cl.
CPC ......... *H10K 30/865* (2023.02); *H10K 10/486* (2023.02); *H10K 50/11* (2023.02); *H10K 71/00* (2023.02); *H10K 2102/351* (2023.02); *H10K 2102/361* (2023.02)

(58) Field of Classification Search
None
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |

(Continued)

FOREIGN PATENT DOCUMENTS

| | | | | |
|---|---|---|---|---|
| CN | 1599669 A | * | 3/2005 | ........ B41M 5/38207 |
| CN | 104347671 A | * | 2/2015 | ......... H01L 51/5246 |

(Continued)

OTHER PUBLICATIONS

Baldo et al., "Highly Efficient Phosphorescent Emission from Organic Electroluminescent Devices," Nature, vol. 395, pp. 151-154 (1998).

(Continued)

*Primary Examiner* — Michael Lebentritt
(74) *Attorney, Agent, or Firm* — Riverside Law LLP

(57) ABSTRACT

An organic electronic device comprises a substrate, at least one morphological stabilizing layer positioned over the substrate, the morphological stabilizing layer comprising a material having a $T_g$ greater than 50° C., and at least one organic layer positioned in direct contact with the morphological stabilizing layer. A method of making an organic electronic device is also disclosed.

17 Claims, 8 Drawing Sheets

(56) References Cited

U.S. PATENT DOCUMENTS

| | | | |
|---|---|---|---|
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,179,543 | B2 * | 2/2007 | Forrest .............. H10K 71/30 428/917 |
| 7,279,704 | B2 | 10/2007 | Walters |
| 7,431,968 | B1 | 10/2008 | Shtein |
| 7,968,146 | B2 | 6/2011 | Wagner |
| 2003/0054197 | A1 * | 3/2003 | Kwong .............. H10K 50/14 428/917 |
| 2003/0230980 | A1 | 12/2003 | Forrest |
| 2004/0174116 | A1 | 9/2004 | Lu |
| 2013/0026452 | A1 | 1/2013 | Kottas |
| 2013/0119354 | A1 | 5/2013 | Ma |

FOREIGN PATENT DOCUMENTS

| | | | |
|---|---|---|---|
| CN | 104508852 A * | 4/2015 | ............ C09K 11/06 |
| DE | 102010023620 A1 * | 12/2011 | ......... H01L 51/5268 |
| EP | 1238981 | 9/2002 | |
| JP | 2010135467 | 6/2010 | |
| WO | 2004111066 A1 | 12/2004 | |
| WO | 2008044723 | 4/2008 | |
| WO | 2008057394 A1 | 5/2008 | |
| WO | 2010011390 A2 | 1/2010 | |
| WO | 2010111175 | 9/2010 | |
| WO | WO-2017188679 A1 * | 11/2017 | ............ C07C 15/28 |
| WO | WO-2019225989 A1 * | 11/2019 | ........... C07D 209/82 |

OTHER PUBLICATIONS

Baldo et al., "Very High-Efficiency Green Organic Light-Emitting Devices Based on Electrophosphorescence," Appl. Phys. Lett., vol. 75, No. 1, pp. 4-6 (1999).

Burlingame, Q., Zanotti, G., Ciammaruchi, L., Katz, E. A. & Forrest, S. R. Outdoor operation of small-molecule organic photovoltaics. Org. Electron. 41, 274-279 (2017).

Fischer, A. et al. Full Electrothermal OLED Model Including Nonlinear Self-heating Effects. Phys. Rev. Appl. 10, 014023 (2018). 12 pages.

Kim, J., et al., Systematic Control of the Orientation of Organic Phosphorescent Pt Complexes in Thin Films for Increased Optical Outcoupling. Advanced Materials 2019, 1900921, 12 pages.

Kwak, J. et al. Hole transport materials with high glass transition temperatures for highly stable organic light-emitting diodes. Thin Solid Films 520, 7157-7163 (2012).

Lieb, M. A., et al., Single-Molecule Orientations Determined by Direct Emission Pattern Imaging. J. Opt. Soc. Am. B 2004, 21 (6), 1210-1215. https://doi.org/10.1364/JOSAB.21.001210.

Mizusaki, M. et al. P-44: Long Lifetime and High Performance OLED Display with Wide Temperature Range for Automotive Application. SID Symp. Dig. Tech. Pap. 50, 1400-1403 (2019).

Price, J. S. et al. Fluoropolymer-diluted small molecule organic semiconductors with extreme thermal stability. Appl. Phys. Lett. 113, 263302 (2018). 6 pages.

Ràfols-Ribé, J. et al. High-performance organic light-emitting diodes comprising ultrastable glass layers. Sci. Adv. 4, eaar8332 (2018). 9 pages.

Savikhin, V. et al. Morphological, Chemical, and Electronic Changes of the Conjugated Polymer PTB7 with Thermal Annealing. iScience 2, 182-192 (2018).

Schuller, J. A., et al., Orientation of Luminescent Excitons in Layered Nanomaterials. Nat. Nanotechnol. 2013, 8 (4), 271-276. https://doi.org/10.1038/nnano.2013.20.

* cited by examiner

OPTOELECTRONIC DEVICE INCLUDING MORPHOLOGICAL STABILIZING LAYER

CROSS-REFERENCE TO RELATED APPLICATIONS

This application claims priority to U.S. Provisional Application No. 63/126,676, filed on Dec. 17, 2020, incorporated herein by reference in its entirety.

STATEMENT REGARDING FEDERALLY SPONSORED RESEARCH OR DEVELOPMENT

This invention was made with government support under DE-SC0017971 awarded by the Department of Energy. The government has certain rights in the invention.

BACKGROUND

Optoelectronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Organic electronic devices these days are often utilized outdoors surrounded by severe environments such as high temperature or a massive amount of sun light. Furthermore, outdoor use, such as automotive taillights, requires a high level of luminance for organic light emitting diodes (>10,000 cd/m2), which accompanies Joule heating. These conditions cause heat transfer into the layers comprising the device, which leads to the morphological change due to the weak van der Waals bond. These morphological changes cause the increase in film roughness and exacerbates the quality which eventually shortens the device operational lifetime. A number of methods have been proposed to enhance the thermal stability of the film such as using the high glass transition (Tg) materials, mixing in high Tg materials and elevating the temperature while growing the layers. However, these methods require changing the composition of the layer that limits the selectivity of the material for the device or require substrate heating during the deposition, which is difficult to apply for a mass production line.

SUMMARY OF THE DISCLOSURE

In one aspect an organic electronic device comprises a substrate, at least one morphological stabilizing layer positioned over the substrate, the morphological stabilizing layer comprising a material having a $T_g$ greater than 50° C., and at least one organic layer positioned in direct contact with the morphological stabilizing layer.

In one embodiment the at least one organic layer is an organic emissive layer. In one embodiment the at least one morphological stabilizing layer has a thickness of less than 50 nm. In one embodiment the at least one morphological stabilizing layer has a thickness of less than 30 nm. In one embodiment the at least one morphological stabilizing layer is positioned within the at least one organic layer. In one embodiment the at least one morphological stabilizing layer is positioned directly on a surface of the at least one organic layer. In one embodiment the at least one morphological stabilizing layer comprises the glass transition temperature higher than 90° C. In one embodiment the at least one organic layer forms part of an organic thin film transistor. In one embodiment the at least one organic layer is a channel body of an organic thin film transistor. In one embodiment wherein the at least one organic layer comprises a heterojunction bilayer.

In another aspect a method of making an organic electronic device comprises providing a substrate, depositing a morphological stabilizing layer over the substrate, depositing at least one organic layer over the morphological stabilizing layer, and annealing the morphological stabilizing layer and the organic layer at a temperature of at least 50° C. for a duration of at least 30 minutes.

In one embodiment the glass transition temperature of the morphological stabilizing layer is higher than 50° C. In one embodiment the temperature is at least 80° C. In one embodiment the duration is at least two hours. In one embodiment the temperature is between 90° C. and 100° C. In one embodiment the duration is between 150 minutes and 210 minutes. In one embodiment the method further comprises depositing a second organic layer between the substrate and the morphological stabilizing layer. In one embodiment the at least one organic layer comprises a heterojunction bilayer. In one embodiment the heterojunction bilayer comprises CBP. In one embodiment the heterojunction bilayer comprises TPBi. In one embodiment the morphological stabilizing layer comprises a material having a glass transition temperature higher than 90° C.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which.

DETAILED DESCRIPTION

Figure 1:
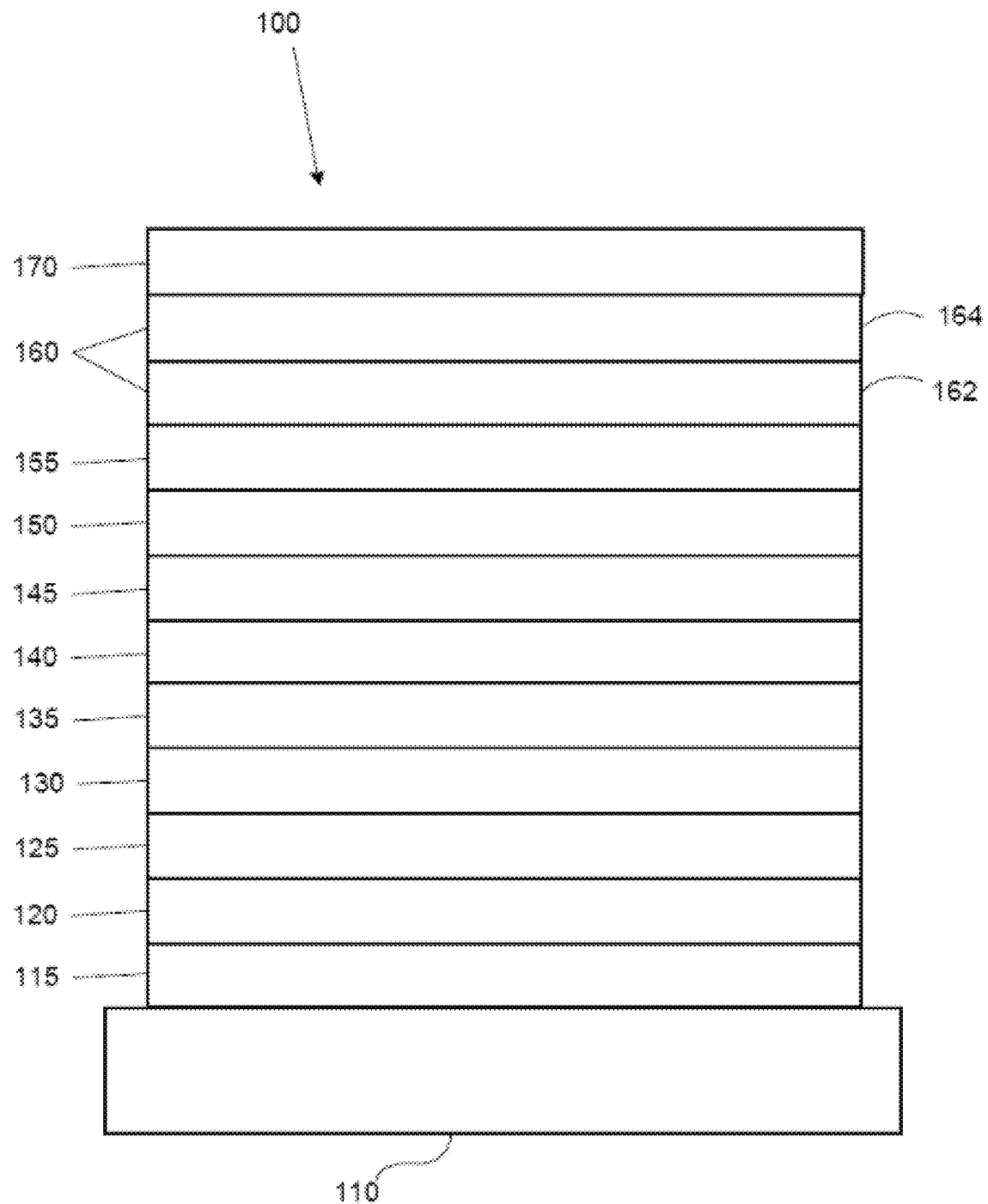
FIG. 1 shows an organic light emitting device in accordance with one embodiment.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

As used herein, and as would be understood by one skilled in the art, "ITO" refers to Indium Tin Oxide. "CBP" refers to 4,4'-Bis(N-carbazolyl)-1,1'-biphenyl. "TBPi" refers to 2,2',2"-(1,3,5-Benzinetriyl)-tris(1-phenyl-1-H-benzimidazole). "PtOEP" refers to Pt Octaethylporphyrin.

Disclosed herein is a device and method to improving the thermal stability of an organic layer. By pre-depositing an organic layer with high glass transition temperature (Tg), which we define as the morphological stabilizing layer (MSL), before the layer of interest. The MSL is thermally stable, therefore being resistant to the applied thermal energy that cause morphological variation, and hinders the molecules deposited on the MSL from moving via van der Waals attraction force, leading to a suppressed crystallization. The MSL being thermally stable reduces the movement of the molecules on the layer via π-π stacking with the molecules above. This method is especially useful for the case such as organic thin film transistors, where the channel body should be kept thin and morphologically stable. The enhanced thermal stability of the film ultimately leads to an improved device operational lifetime. Fourier plane imaging microscopy was utilized to measure the difference between the structure with and without the underlying high Tg layer.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
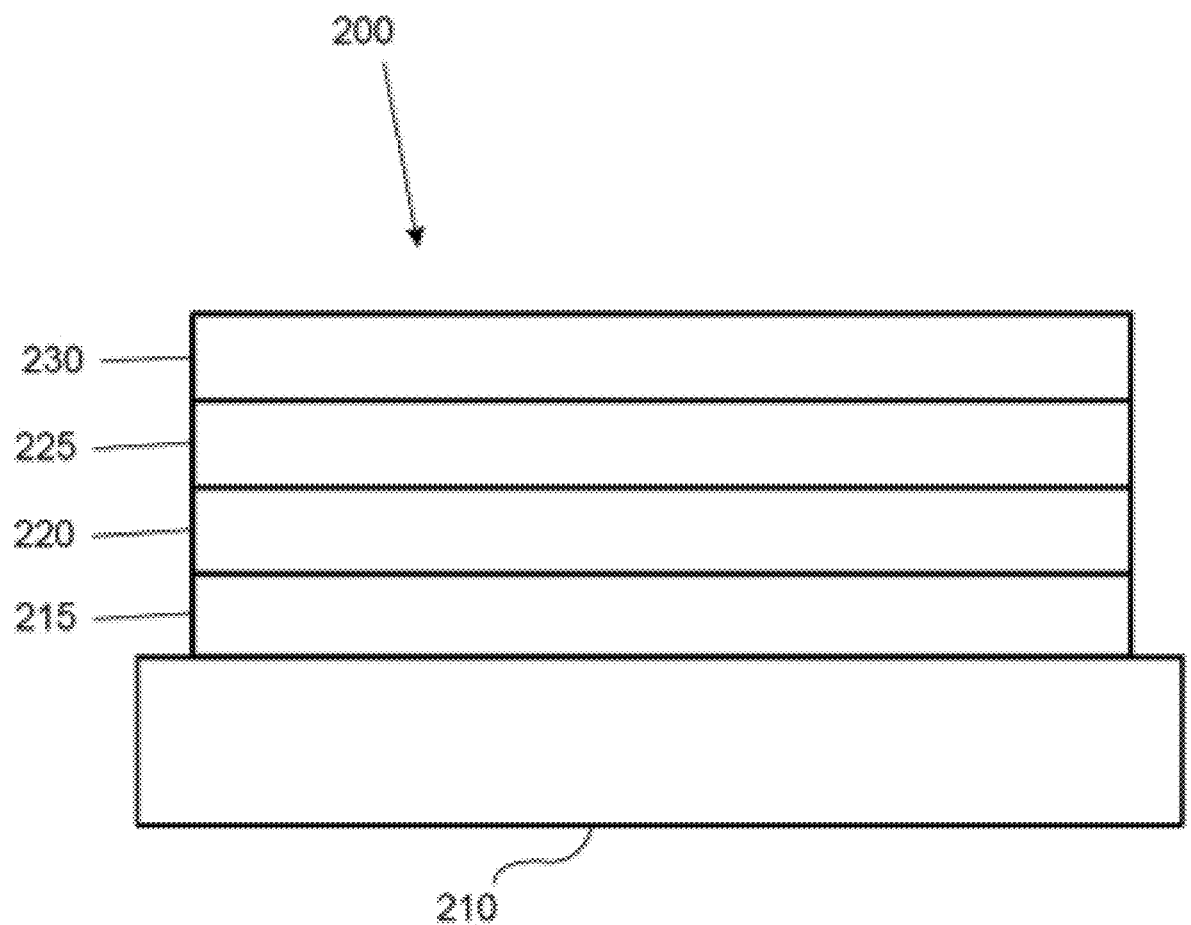
FIG. 2 shows an inverted organic light emitting device that does not have a separate electron transport layer in accordance with one embodiment.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIG. 1 and FIG. 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers.

The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIG. 1 and FIG. 2.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theaters or stadium screens, light therapy devices, and signs. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

Although certain embodiments of the disclosure are discussed in relation to one particular device or type of device (for example OLEDs) it is understood that the disclosed improvements to light outcoupling properties of a substrate may be equally applied to other devices, including but not limited to PLEDs, OPVs, charge-coupled devices (CCDs), photosensors, or the like.

Although exemplary embodiments described herein may be presented as methods for producing particular circuits or devices, for example OLEDs, it is understood that the materials and structures described herein may have applications in devices other than OLEDs. For example, other optoelectronic devices such as organic solar cells and organic photodetectors may employ the materials and structures. More generally, organic devices, such as organic transistors, or other organic electronic circuits or components, may employ the materials and structures.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

Certain embodiments of the disclosure relate to a light emitting device comprising an emissive layer (EML) spaced far from a cathode as described herein. Conventional organic light emitting devices typically place the EML near a metal cathode which incurs plasmon losses due to near field coupling. To avoid exciting these lossy modes it is necessary to space the EML far from the cathode. However, utilizing a thick electron transport layer (ETL) can be problematic due to changes in charge balance and increased resistivity. These problems can be overcome by utilizing a charge generation layer, for example a charge generation layer comprising at least one electron transport layer and at least one hole transport layer, to convert electron into hole current. This allows the use of higher mobility hole transporting materials and maintains the charge balance of the device. In some embodiments, the charge generation layer may be replaced or combined with any other layer capable of conducting electrons.

Figure 3A:
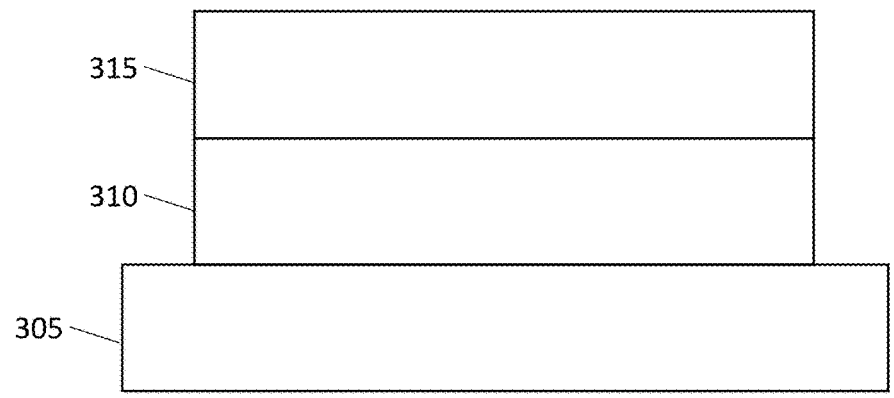
FIG. 3A shows an optoelectronic device including a morphological stabilizing layer in accordance with one embodiment.
Figure 3B:
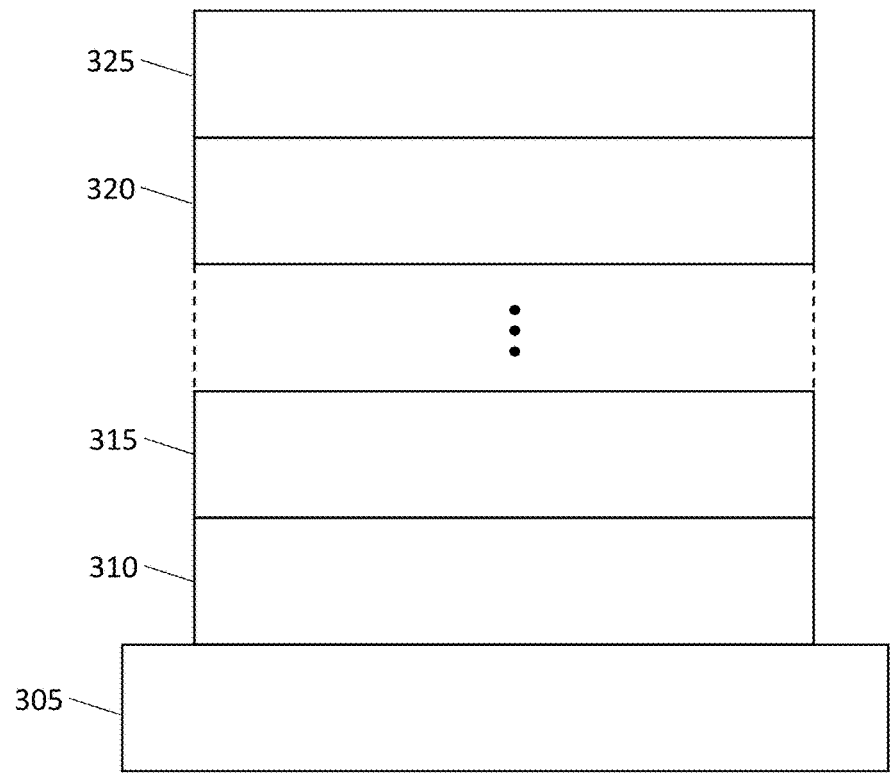
FIG. 3B shows an optoelectronic device including morphological stabilizing layers in accordance with one embodiment.
Figure 3C:
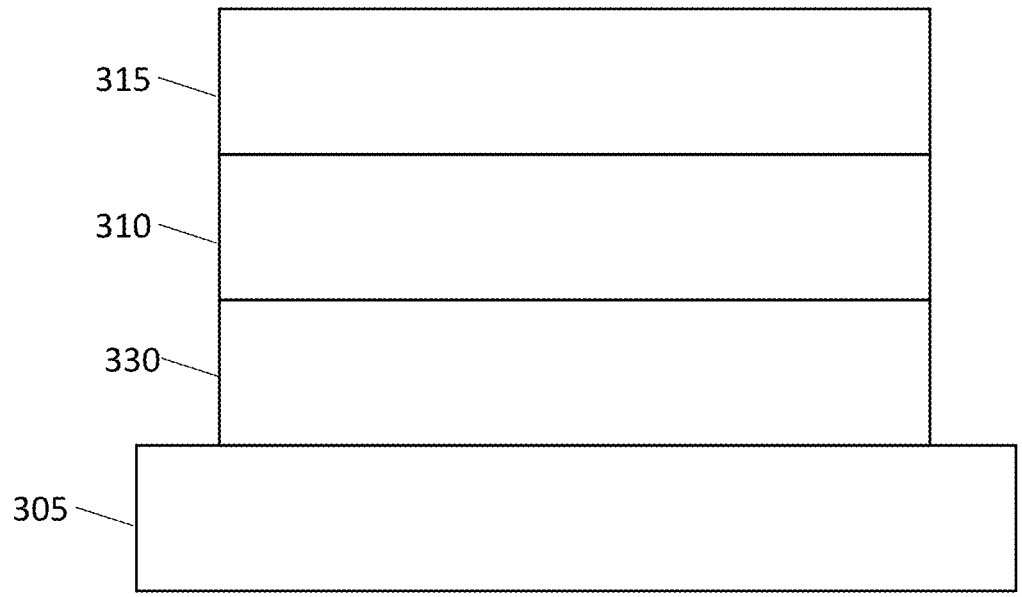
FIG. 3C shows an optoelectronic device including a morphological stabilizing layer in accordance with one embodiment.

With reference to FIGS. 3A, 3B, and 3C, example embodiments of organic electronic devices (300, 301, 302) are depicted. The devices (300, 301, 302) include a substrate 305, at least one morphological stabilizing layer (MSL) 310 positioned over the substrate, and at least one organic layer 315 positioned in direct contact with the MSL 310. In one embodiment, the MSL 310 comprises a material having a $T_g$ greater than 95° C.

FIG. 3A shows a device 300 including a substrate 305, a morphological stabilizing layer (MSL) 310 positioned over the substrate 305, and an organic layer 315 positioned in direct contact and over the MSL 310. In one embodiment, more than one MSL 310 is utilized. In one embodiment, more than one organic layer 315 is utilized. In one embodiment, the MSL 310 does not require orthogonal transition dipole moments (TDMs), but requires high $T_g$ material to pin the morphology of the above layer.

FIG. 3B shows another example embodiment of a device 301. A first MSL 310 is positioned over a substrate 305, and a first organic layer 315 is in direct contact with and positioned above the first MSL 310. A second organic layer 325 in direct contact with and positioned directly above a second MSL 320 can be further layered above the first organic layer 315. Additional layer pairs of MSL and organic layers can be deposited above the second organic layer 325. In one embodiment, other layers such as those described in FIGS. 1 and 2 can be deposited between any two of the first MSL 310, the first organic layer 315, the second MSL 320, and the second organic layer 325.

FIG. 3C shows another example embodiment of a device 302 where a second organic layer 330 is deposited between the substrate 305 and the morphological stabilizing layer 310. The concepts of FIGS. 3A, 3B and 3C can further be combined to produce additional layer structuring.

In one embodiment, the at least one organic layer (315, 325, 330) is an organic emissive layer. In one embodiment the MSL 310 has a thickness of less than 50 nm. In one embodiment, the MSL 310 has a thickness of less than 30 nm. In one embodiment, the MSL 310 is positioned within the organic layer 315. In one embodiment, the MSL 310 is positioned directly on a surface of the organic layer 315. In one embodiment, the MSL 310 comprises a material having a glass transition temperature higher than 40° C. In one embodiment, the organic layer 315 forms part of an organic thin film transistor. In one embodiment, the organic layer 315 is a channel body of an organic thin film transistor. In one embodiment, the organic layer 315 comprises a heterojunction bilayer. In one embodiment, the heterojunction bilayer comprises CBP. In one embodiment, the heterojunction bilayer comprises TPBi.

Figure 4:
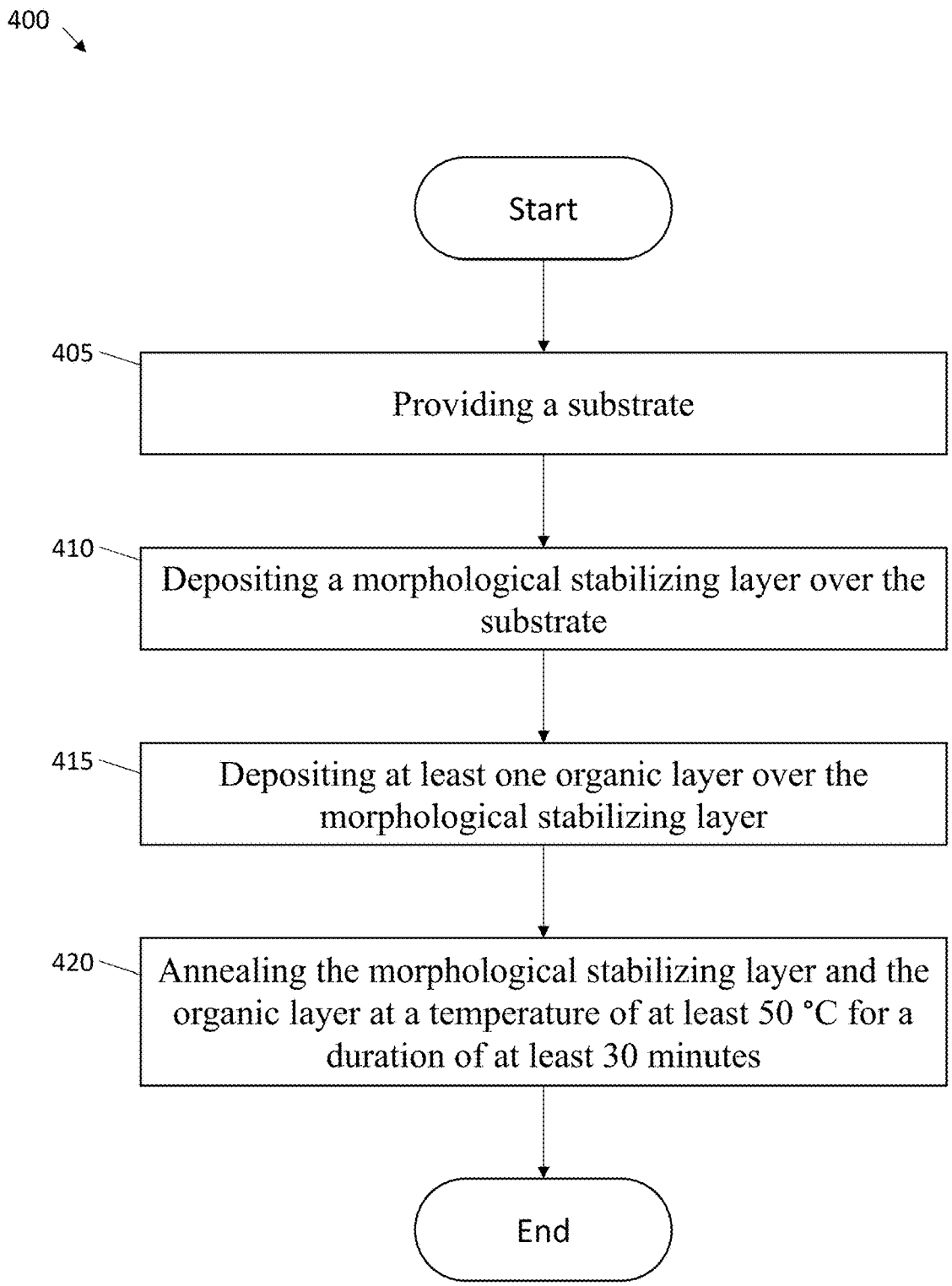
FIG. 4 is a flow chart depicting a method of make an optoelectronic device in accordance with one embodiment.

FIG. 4 is a flow chart depicting a method 400 of making an organic electronic device 300. The method 400 begins at operation 405 where a substrate 305 is provided. At operation 410 a morphological stabilizing layer (MSL) 310 is deposited over the substrate 305. At Operation 415 at least one organic layer 315 is deposited over the MSL 310. At Operation 420 the device 300 along with the MSL 310 and the organic layer 315 are annealed at a temperature of at least 50° C. for a duration of at least 30 minutes.

In one embodiment the glass transition temperature of the morphological stabilizing layer is higher than 40° C. In some embodiments, the glass transition temperature of at least one material in the morphological stabilizing layer is at least 40° C., at least 45° C., at least 50° C., at least 55° C., at least 60° C., at least 65° C., at least 70° C., at least 75° C., at least 80° C., at least 85° C., at least 90° C., at least 95° C., at least 100° C., at least 110° C., or at least 120° C. In one embodiment the annealing temperature is at least 40° C., at least 45° C., at least 50° C., at least 55° C., at least 60° C., at least 65° C., at least 70° C., at least 75° C., at least 80° C., at least 85° C., at least 90° C., at least 95° C., at least 100° C., at least 110° C., or at least 120° C. In one embodiment the annealing duration is at least two hours. In one embodiment, the annealing temperature is between 90° C. and 100° C. In one embodiment, the annealing duration is between 150 minutes and 210 minutes.

In one embodiment, a second MSL 320 and a second organic layer 325 are deposited above the organic layer 315. In one embodiment, a second organic layer 330 is deposited between the substrate 305 and the morphological stabilizing layer 310. In one embodiment, the at least one organic layer 315 comprises a heterojunction bilayer. In one embodiment, the heterojunction bilayer comprises CBP. In one embodiment, the heterojunction bilayer comprises TPBi. In one embodiment the morphological stabilizing layer 310 comprises a material having the glass transition temperature higher than 40° C.

Devices of the present disclosure may comprise one or more electrodes, some of which may be fully or partially transparent or translucent. In some embodiments, one or more electrodes comprise indium tin oxide (ITO) or other transparent conductive materials. In some embodiments, one or more electrodes may comprise flexible transparent and/or conductive polymers.

Layers may include one or more electrodes, organic emissive layers, electron- or hole-blocking layers, electron- or hole-transport layers, buffer layers, or any other suitable layers known in the art. In some embodiments, one or more of the electrode layers may comprise a transparent flexible material. In some embodiments, both electrodes may comprise a flexible material and one electrode may comprise a transparent flexible material.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIG. 1 and FIG. 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Some OLED structures and similar devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

The materials, structures, and techniques described herein may have applications in devices other than the fabrication of OLEDs. For example, other optoelectronic devices such as organic solar cells and organic photodetectors may employ the materials and structures. More generally, organic devices, such as organic transistors, may employ the materials and structures.

An OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, an OLED fabricated using devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present disclosure is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

The CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OLEDs and other similar devices may be fabricated using a variety of techniques and devices. For example, in OVJP and similar techniques, one or more jets of material is directed at a substrate to form the various layers of the OLED.

EXPERIMENTAL EXAMPLES

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Device Fabrication and Measurements

The example device 300, was fabricated and various experimental measurements were performed.

Results

Figure 5:
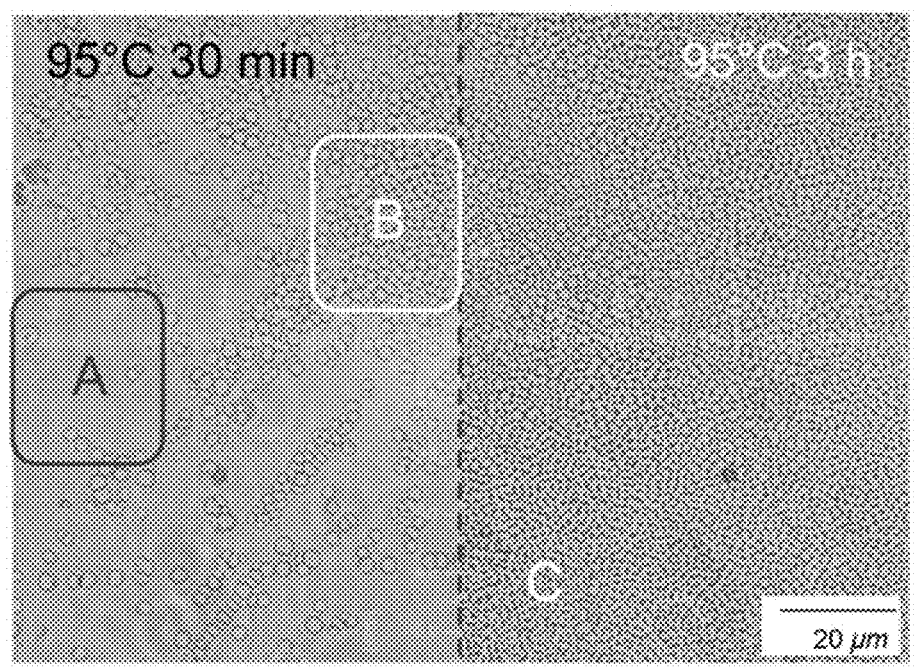
FIG. 5 shows a microscopic image of an optoelectronic device in accordance with one embodiment.
Figure 6:
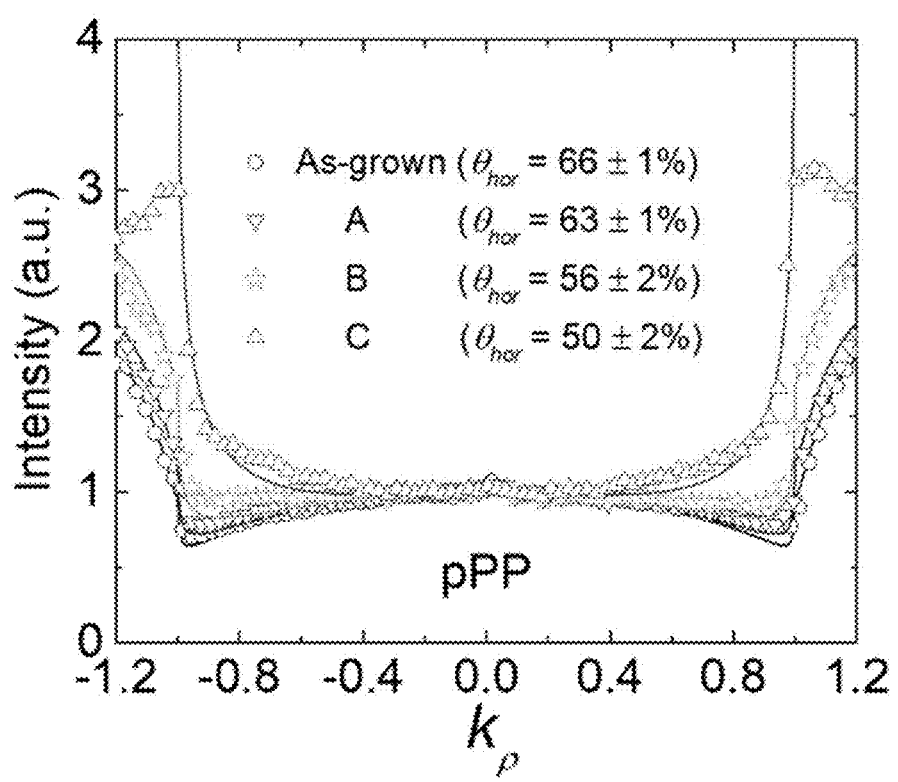
FIG. 6 shows a plot of the intensity profile in pPP of an optoelectronic device in accordance with one embodiment.
Figure 7:
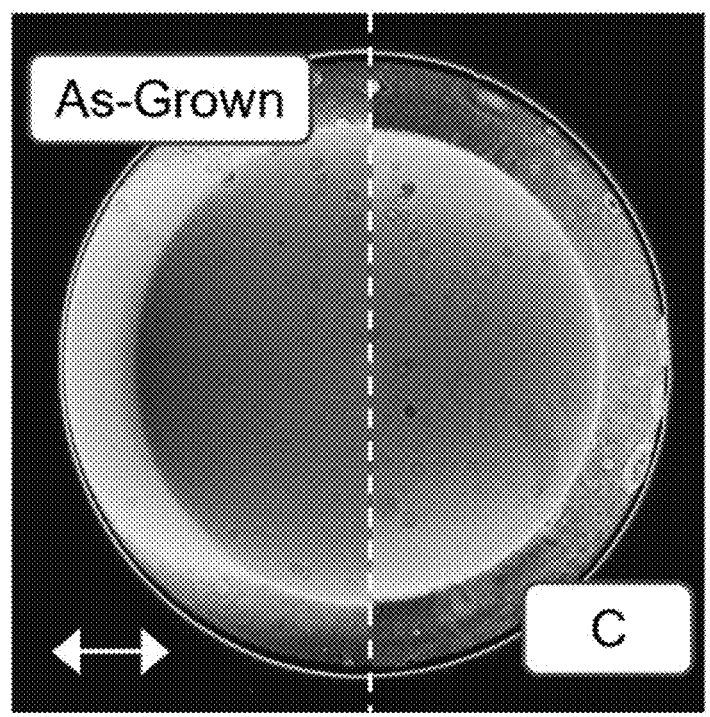
FIG. 7 is a comparison of pole plots of optoelectronic devices in accordance with one embodiment.

In one example experiment, the morphology of the CBP organic layer 315 was investigated via a PtOEP sensing layer. FIG. 5 shows a microscopic image of CBP 15 nm/PtOEP 0.1 nm/CBP 15 nm annealed at 95° C. for 30 minutes (left) and 3 hours (right). FIG. 6 plots the intensity profile in pPP of as-grown (Ctrl) and regions A-C of FIG. 5. FIG. 7 is a comparison of the polar plots between the as-grown and 3 hours annealed samples, region C of FIG. 5.

Fourier plane imaging microscopy (FIM) was used to measure the morphology of the films. FIG. 5 shows the data obtained from microscopic morphology with FIM. An ultra-thin (~1 Å) Pt Octaethylporphyrin (PtOEP) layer was deposited in the middle of a 30 nm thick 4,4'-Bis(N-carbazolyl)-1,1'-biphenyl (CBP) thin film and anneal the film at 95° C. The left section of FIG. 5 is the microscopic image of the film after 30 minutes of annealing showing a mixed status of crystallization (region A and B). After 3 hours, the film becomes uniformly crystallized as shown in the right section (region C corresponds to the whole film). FIG. 6 graphs the measured normalized intensity profile in pPP in region A, B and C, showing a decreased $\theta_{hor}$ (66±1%→50±2%) after 3 hours of annealing. The $\theta_{hor}$ is a ratio of horizontal-to-vertically aligned TDMs with $\theta_{hor}$=67% for random alignment and 100% for all TDMs oriented parallel to the substrate. PtOEP is a disk-shaped molecule comprising two orthogonal TDMs in the molecular plane. Therefore, 50% of the emission from a perfectly vertically oriented PtOEP molecule is from the horizontally aligned TDM, leading to $\theta_{hor}$ between 50% and 100%, otherwise $\theta_{hor}$=67% for isotropic (i.e. random) molecular orientation. FIG. 7 shows the pole plot image of the as-grown (As-grown) and 3 hours annealed (C) film with a noticeable difference.

Figure 8:
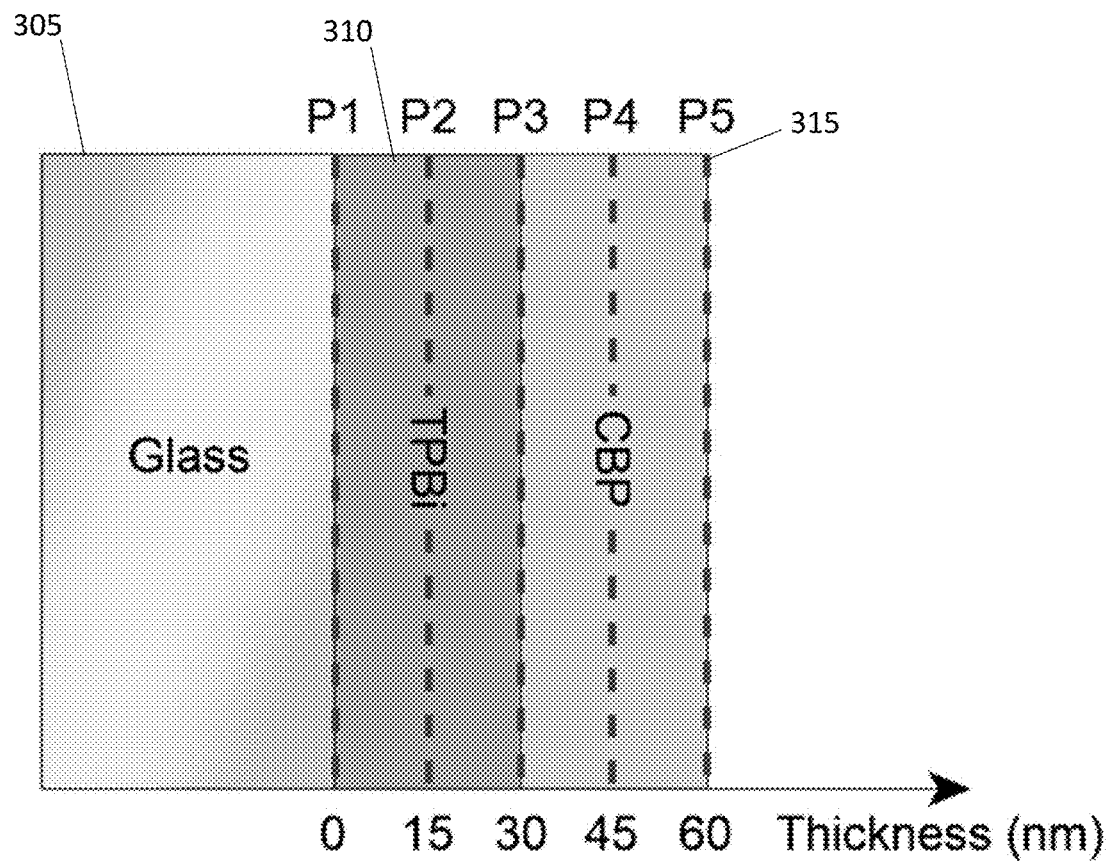
FIG. 8 is a diagram of an optoelectronic device in accordance with one embodiment.
Figure 9:
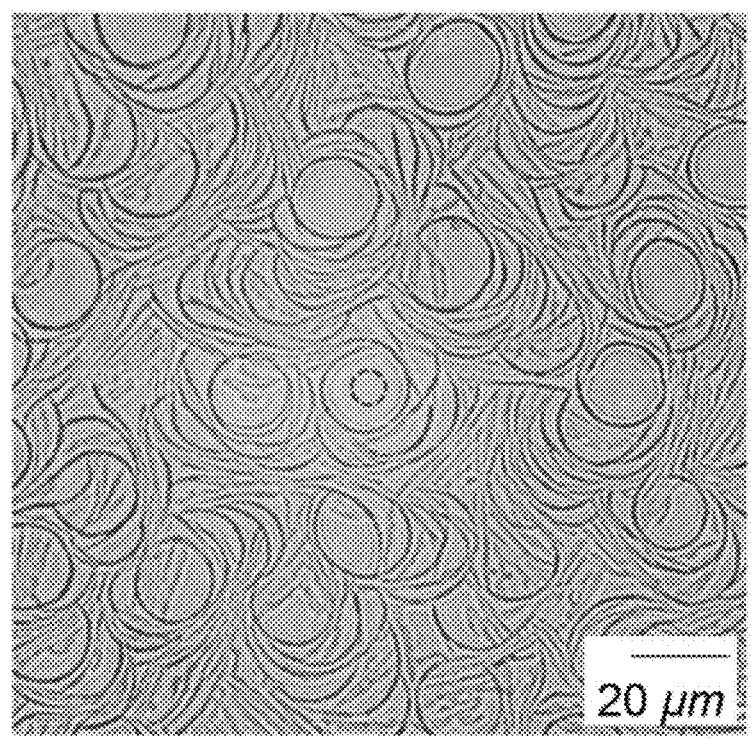
FIG. 9 is a microscopic image of an annealed optoelectronic device in accordance with one embodiment.
Figure 10:
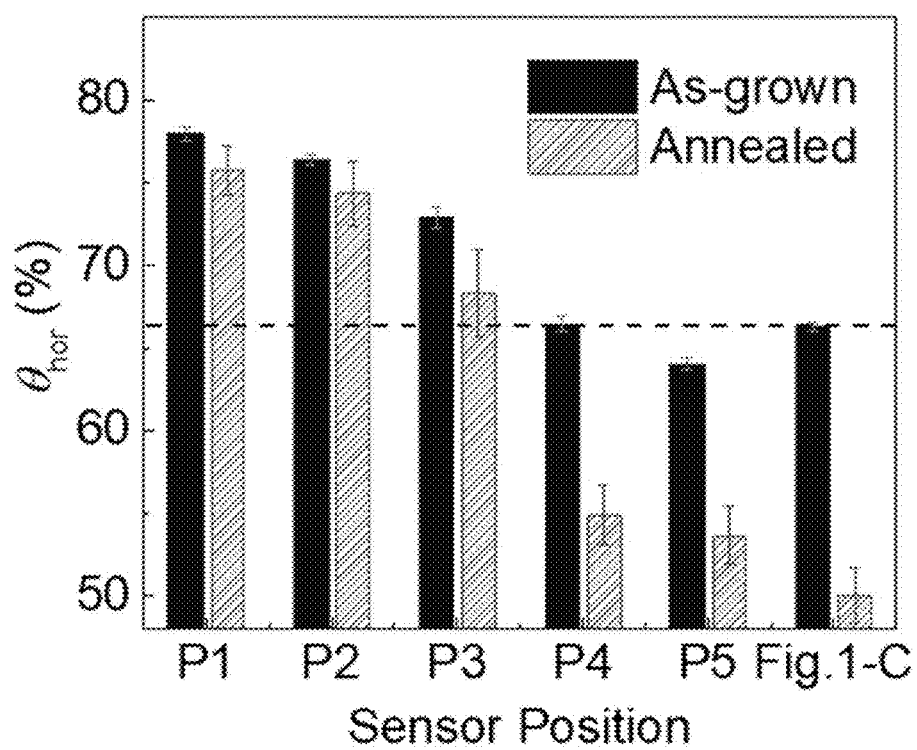
FIG. 10 is a plot showing Nor of an optoelectronic device in accordance with one embodiment.

In another example experiment the morphological sensing layer was demonstrated. FIG. 8 is a diagram showing the positions of ultrathin PtOEP sensing layers within the CBP/TPBi bilayer structure. FIG. 9 is a microscopic image of the annealed P4 sample. The red circle indicates the size of the optical pump. FIG. 10 is a plot of the measured $\theta_{hor}$ of as-grown (Ctrl) and 3 hours annealed samples. Dashed line designates the isotropic, random alignment ($\theta_{hor}$=0.67).

A planar heterojunction bilayer was deposited comprising 30 nm 2,2',2"-(1,3,5-Benzinetriyl)-tris(1-phenyl-1-H-benzimidazole) (TPBi) and CBP with PtOEP sensing layers placed in different depths (P1-5) as shown in FIG. 8. FIG. 9 shows the image of the film after annealing at 95° C. for 3 hours. The red circle in the center shows the size of the optical pump used for the experiment. In FIG. 10, the $\theta_{hor}$ of the as-grown (Ctrl) and annealed samples in different positions is graphed. A noticeable difference of $\theta_{hor}$ appears in P4-5, whereas the variation in P1-3 is relatively small. However, the variation of P4-5 is still smaller compared to the difference of the sample in FIG. 5, region C.

The minimal change in P3 should be noted since this shows that the suppression of morphological change is very high near the interface cause by the π-π van der Waals interaction between the CBP molecule and the MSL (TPBi layer), and becomes weaker as the thickness increases, showing larger morphological change in P4. However, the variation of P4 is smaller compared to FIG. 5 region C, demonstrating that depositing MSL prior to the layer with low thermal stability could mitigate the crystallization of the film. Thus depositing MSL could greatly help suppressing the morphological variation in several nanometer scale. Additionally, alternating layers of MSL and the layer of interest is expected to suppress the majority of morphological variation, enhancing the thermal stability of the film.

The following references are incorporated by reference in their entirety:

1. Mizusaki, M. et al. P-44: Long Lifetime and High Performance OLED Display with Wide Temperature Range for Automotive Application. SID Symp. Dig. Tech. Pap. 50, 1400-1403 (2019).
2. Burlingame, Q., Zanotti, G., Ciammaruchi, L., Katz, E. A. & Forrest, S. R. Outdoor operation of small-molecule organic photovoltaics. Org. Electron. 41, 274-279 (2017).
3. Fischer, A. et al. Full Electrothermal OLED Model Including Nonlinear Self-heating Effects. Phys. Rev. Appl. 10, 014023 (2018).
4. Savikhin, V. et al. Morphological, Chemical, and Electronic Changes of the Conjugated Polymer PTB7 with Thermal Annealing. iScience 2, 182-192 (2018).
5. Kwak, J. et al. Hole transport materials with high glass transition temperatures for highly stable organic light-emitting diodes. Thin Solid Films 520, 7157-7163 (2012).
6. Price, J. S. et al. Fluoropolymer-diluted small molecule organic semiconductors with extreme thermal stability. Appl. Phys. Lett. 113, 263302 (2018).
7. Ràfols-Ribé, J. et al. High-performance organic light-emitting diodes comprising ultrastable glass layers. Sci. Adv. 4, eaar8332 (2018).
8. Lieb, M. A., Zavislan, J. M. & Novotny, L. Single-molecule orientations determined by direct emission pattern imaging. J Opt Soc Am B 21, 1210-1215 (2004).
9. Schuller, J. A. et al. Orientation of luminescent excitons in layered nanomaterials. Nat. Nanotechnol. 8, 271-276 (2013).
10. Kim, J. et al. Systematic Control of the Orientation of Organic Phosphorescent Pt Complexes in Thin Films for Increased Optical Outcoupling. Adv. Mater. 31, 1900921 (2019).

The disclosures of each and every patent, patent application, and publication cited herein are hereby incorporated herein by reference in their entirety. While devices and methods have been disclosed with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

The invention claimed is:

1. An organic electronic device, comprising:
a substrate;
at least one morphological stabilizing layer positioned over the substrate, the morphological stabilizing layer comprising a material having a $T_g$ greater than 50° C.; and at least one organic emissive layer positioned in direct contact with the morphological stabilizing layer;

wherein the morphological stabilizing layer improves the horizontal dipole alignment of the organic emissive layer by at least 3%.

2. The organic electronic device of claim 1, wherein the at least one morphological stabilizing layer has a thickness of less than 50 nm.

3. The organic electronic device of claim 2, wherein the at least one morphological stabilizing layer has a thickness of less than 30 nm.

4. The organic electronic device of claim 1, wherein the at least one morphological stabilizing layer is positioned within the at least one organic layer.

5. The organic electronic device of claim 1, wherein the at least one morphological stabilizing layer is positioned directly on a surface of the at least one organic layer.

6. The organic electronic device of claim 1, wherein the material in the morphological stabilizing layer has a glass transition temperature higher than 90° C.

7. The organic electronic device of claim 1, wherein the at least one organic layer forms part of an organic thin film transistor.

8. The organic electronic device of claim 7, wherein the at least one organic layer is a channel body of an organic thin film transistor.

9. The organic electronic device of claim 1, wherein the at least one organic layer comprises a heterojunction bilayer.

10. A method of making an organic electronic device, comprising:

providing a substrate;

depositing a morphological stabilizing layer over the substrate;

depositing at least one organic emissive layer directly on top of the over the morphological stabilizing layer; and annealing the morphological stabilizing layer and the organic emissive layer at an annealing temperature of at least 50° C. for an annealing duration of at least 30 minutes, causing an improvement of at least 3% in the horizontal dipole alignment of the organic emissive layer.

11. The method of claim 10, wherein the glass transition temperature of at least one material in the morphological stabilizing layer is higher than 50° C.

12. The method of claim 10, wherein the annealing temperature is at least 80° C.

13. The method of claim 10, wherein the annealing duration is at least two hours.

14. The method of claim 10, wherein the annealing temperature is between 90° C. and 100° C.

15. The method of claim 10, wherein the annealing duration is between 150 minutes and 210 minutes.

16. The method of claim 10, further comprising depositing a second organic layer between the substrate and the morphological stabilizing layer.

17. The method of claim 11, wherein the glass transition temperature of the at least one material in the morphological stabilizing layer is higher than 90° C.

* * * * *

UNITED STATES PATENT AND TRADEMARK OFFICE
CERTIFICATE OF CORRECTION

| | |
|---|---|
| PATENT NO. | : 12,150,321 B2 |
| APPLICATION NO. | : 17/528821 |
| DATED | : November 19, 2024 |
| INVENTOR(S) | : Jongchan Kim et al. |

It is certified that error appears in the above-identified patent and that said Letters Patent is hereby corrected as shown below:

In the Claims

Claim 10 should read as follows:
10. A method of making an organic electronic device, comprising:
    providing a substrate;
    depositing a morphological stabilizing layer over the substrate;
    depositing at least one organic emissive layer directly on top of the morphological stabilizing layer; and
    annealing the morphological stabilizing layer and the organic emissive layer at an annealing temperature of at least 50° C. for an annealing duration of at least 30 minutes, causing an improvement of at least 3% in the horizontal dipole alignment of the organic emissive layer.

Signed and Sealed this
Twentieth Day of May, 2025

Coke Morgan Stewart
*Acting Director of the United States Patent and Trademark Office*